(12) United States Patent
Schowalter et al.

(10) Patent No.: US 10,971,665 B2
(45) Date of Patent: *Apr. 6, 2021

(54) PHOTON EXTRACTION FROM NITRIDE ULTRAVIOLET LIGHT-EMITTING DEVICES

(71) Applicants: Leo J. Schowalter, Latham, NY (US); Jianfeng Chen, Ballston Lake, NY (US); James R. Grandusky, Waterford, NY (US)

(72) Inventors: Leo J. Schowalter, Latham, NY (US); Jianfeng Chen, Ballston Lake, NY (US); James R. Grandusky, Waterford, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/801,358

(22) Filed: Feb. 26, 2020

(65) Prior Publication Data

US 2020/0321498 A1    Oct. 8, 2020

Related U.S. Application Data

(63) Continuation of application No. 16/059,178, filed on Aug. 9, 2018, now Pat. No. 10,615,322, which is a continuation of application No. 14/596,806, filed on Jan. 14, 2015, now Pat. No. 10,074,784, which is a continuation of application No. 13/553,093, filed on Jul. 19, 2012, now Pat. No. 8,962,359.

(60) Provisional application No. 61/509,278, filed on Jul. 19, 2011, provisional application No. 61/552,138, filed on Oct. 27, 2011.

(51) Int. Cl.
| | |
|---|---|
| H01L 33/58 | (2010.01) |
| H01L 33/22 | (2010.01) |
| H01L 33/54 | (2010.01) |
| H01L 33/40 | (2010.01) |
| H01L 33/56 | (2010.01) |

(52) U.S. Cl.
CPC .............. *H01L 33/58* (2013.01); *H01L 33/22* (2013.01); *H01L 33/405* (2013.01); *H01L 33/54* (2013.01); *H01L 33/56* (2013.01); *H01L 2933/0058* (2013.01)

(58) Field of Classification Search
CPC ......... H01L 33/58; H01L 33/54; H01L 33/56; H01L 33/12; H01L 33/22; H01L 33/405; H01L 2933/0058
See application file for complete search history.

(56) References Cited

U.S. PATENT DOCUMENTS

| | | | |
|---|---|---|---|
| 6,365,920 | B1 | 4/2002 | Abramov et al. |
| 6,921,929 | B2 | 7/2005 | LeBoeuf et al. |
| 6,961,190 | B1 | 11/2005 | Tamaoki et al. |
| 7,821,023 | B2 | 10/2010 | Yuan et al. |
| 7,832,885 | B2 | 11/2010 | Hsiao et al. |
| 7,902,566 | B2 | 3/2011 | Paolini et al. |

(Continued)

*Primary Examiner* — Michael M Trinh
(74) *Attorney, Agent, or Firm* — Morgan, Lewis & Bockius LLP

(57) ABSTRACT

In various embodiments, a rigid lens is attached to a light-emitting semiconductor die via a layer of encapsulant having a thickness insufficient to prevent propagation of thermal expansion mismatch-induced strain between the rigid lens and the semiconductor die.

35 Claims, 10 Drawing Sheets

(56) References Cited

U.S. PATENT DOCUMENTS

| | | |
|---|---|---|
| 7,943,952 B2 | 5/2011 | Loh et al. |
| 8,962,359 B2 * | 2/2015 | Schowalter ............. H01L 33/22 |
| | | 438/27 |
| 10,074,784 B2 * | 9/2018 | Schowalter ............. H01L 33/58 |
| 10,615,322 B2 * | 4/2020 | Schowalter ............. H01L 33/58 |
| 2002/0030194 A1 | 3/2002 | Camras et al. |
| 2003/0094664 A1 | 5/2003 | Yagi |
| 2007/0101932 A1 | 5/2007 | Schowalter et al. |
| 2008/0023719 A1 | 1/2008 | Camras et al. |
| 2009/0072263 A1 * | 3/2009 | Paolini ................. H01L 33/508 |
| | | 257/98 |
| 2010/0025713 A1 | 2/2010 | Tao et al. |
| 2010/0073940 A1 * | 3/2010 | Huang ............... G02B 19/0014 |
| | | 362/361 |
| 2011/0062469 A1 | 3/2011 | Camras et al. |
| 2012/0069564 A1 | 3/2012 | Andrews et al. |
| 2019/0035992 A1 | 1/2019 | Schowalter et al. |

* cited by examiner

| CASE # | ENCAPSULANT THICKNESS | LENS | LENS DIAMETER | CYLINDER HEIGHT | PHOTON EXTRACTION EFFICIENCY | FAR FIELD FWHM |
|---|---|---|---|---|---|---|
| 1 | N/A | N/A | N/A | N/A | 1.0X | 120° |
| 2 | 170 μm | FUSED SILICA | 2mm | 0 | 2.2X | 87° |
| 3 | 10 μm | FUSED SILICA | 2mm | 0 | 2.2X | 114° |
| 4 | 10 μm | FUSED SILICA | 2mm | 0.5mm | 2.2X | 70° |
| 5 | 10 μm | FUSED SILICA | 2mm | 1.0mm | 1.9X | 50° |
| 6 | 10 μm | FUSED SILICA | 3mm | 1.0mm | 2.3X | 48° |
| 7 | 10 μm | FUSED SILICA | 3mm | 1.5mm | 1.9X | 32° |
| 8 | 10 μm | FUSED SILICA | 4mm | 1.6mm | 2.2X | 40° |
| 9 | 10 μm | FUSED SILICA | 4mm | 1.9mm | 2.0X | 25° |

FIG. 11

PHOTON EXTRACTION FROM NITRIDE ULTRAVIOLET LIGHT-EMITTING DEVICES

RELATED APPLICATIONS

This application is a continuation of U.S. patent application Ser. No. 16/059,178, filed Aug. 9, 2018, which is a continuation of U.S. patent application Ser. No. 14/596,806, filed Jan. 14, 2015, which is a continuation of U.S. patent application Ser. No. 13/553,093, filed Jul. 19, 2012, which claims the benefit of and priority to U.S. Provisional Patent Application No. 61/509,278, filed Jul. 19, 2011, and U.S. Provisional Patent Application No. 61/552,138, filed Oct. 27, 2011, the entire disclosure of each of which is hereby incorporated herein by reference.

GOVERNMENT SUPPORT

This invention was made with United States Government support under contract W911NF-09-2-0068 with the United States Army. The United States Government has certain rights in the invention.

TECHNICAL FIELD

In various embodiments, the present invention relates to ultraviolet optoelectronic devices fabricated on nitride-based substrates, in particular to improving light extraction therefrom through the use of a surface treatment and attachment of an index-matching lens.

BACKGROUND

The output powers, efficiencies, and lifetimes of short-wavelength ultraviolet light-emitting diodes (UV LEDs), i.e., LEDs that emit light at wavelengths less than 350 nm, based on the nitride semiconductor system remain limited due to high defect levels in the active region. These limitations are particularly problematic (and notable) in devices designed to emit at wavelengths less than 270 nm. Most development effort has been carried out on devices formed on foreign substrates such as sapphire where defect densities remain high despite innovative defect reduction strategies. These high defect densities limit both the efficiency and the reliability of devices grown on such substrates.

The recent introduction of low-defect, crystalline aluminum nitride (AlN) substrates has the potential to dramatically improve nitride-based optoelectronic semiconductor devices, particularly those having high aluminum concentration, due to the benefits of having lower defects in the active regions of these devices. For example, UV LEDs pseudomorphically grown on AlN substrates have been demonstrated to have higher efficiencies, higher power and longer lifetimes compared to similar devices formed on other substrates. Generally, these pseudomorphic UV LEDs are mounted for packaging in a "flip-chip" configuration, where the light generated in the active region of the device is emitted through the AlN substrate, while the LED dies have their front surfaces bonded to a polycrystalline (ceramic) AlN submount. Because of the high crystalline perfection that is achievable in the active device region of such devices, internal efficiencies greater than 60% have been demonstrated. Unfortunately, the photon-extraction efficiency is often still very poor in these devices, ranging from about 4% to about 15% achieved using surface-patterning techniques.

For several reasons, the photon extraction efficiency from short-wavelength UV LEDs is poor compared to visible LEDs. Thus, the current generation of short-wavelength UV LEDs has low wall-plug efficiencies (WPE) of, at best, only a few percent, where WPE is defined as the ratio of usable optical power (in this case, emitted UV light) achieved from the diode divided by the electrical power into the device. The WPE of an LED can be calculated by taking the product of the electrical efficiency ($\eta_{el}$), the photon extraction efficiency ($\eta_{ex}$), and the internal efficiency (IE); i.e., WPE=$\eta_{el}\times\eta_{ex}\times$IE. The IE itself is the product of current injection efficiency ($\eta_{inj}$) and the internal quantum efficiency (IQE); i.e., IE=$\eta_{inj}\times$IQE. Thus, a low $\eta_{ex}$ will deleteriously impact the WPE even after the IE has been improved via the reduction of internal crystalline defects enabled by, e.g., the use of the AlN substrates referenced above as platforms for the devices.

Several issues can contribute to low photon-extraction efficiency. First, even the highest-quality AlN substrates available generally have some absorption in the UV wavelength range, even at wavelengths longer than the band edge in AlN (which is approximately 210 nm). This absorption tends to result in some of the UV light generated in the active area of the device being absorbed in the substrate, hence diminishing the amount of light emitted from the substrate surface. Additionally, UV LEDs suffer because approximately half of the generated photons are directed toward the p-contact and absorbed by the p-GaN of that contact. Even when photons are directed toward the AlN surface, only 9.4% can escape from an untreated surface due to the large index of refraction of the AlN, which results in a small escape cone. Additional photons are lost on their way to the exit surface due to absorption in the AlN wafer. These losses are multiplicative and the average photon extraction efficiency is only about 2.5%.

In typical LED fabrication, the large difference in the index of refraction between the LED structure and air (and resulting lack of photon extraction) can be greatly ameliorated by using an encapsulant with an intermediate index of refraction. Specifically, many conventional designs feature a "dome" of the encapsulant material disposed over and at least partially surrounding the LED (and subsequently cured by a thermal treatment). The encapsulation increases the critical angle of total internal reflection through the top surface of the semiconductor die, which has led to significant improvements in photon-extraction efficiency for visible LEDs.

To further improve photon-extraction efficiency, attempts have been made to attach optical elements to LEDs using either an encapsulant or an adhesive. An advantage of utilizing such an optical element is that the light emitted by the diode may be directed outward in a more precise way (i.e., as defined by the shape and properties of the optical element). However, optical elements and LEDs generally have different coefficients of thermal expansion, which may result in damage to the LED or the bonding material as the LED heats up during operation. Thus, generally quite thick encapsulant layers have been utilized in order to mitigate the effects of this thermal-expansion mismatch and prevent propagation of thermal expansion mismatch-induced strain between the LED and the optical element.

Unfortunately, LED encapsulants and adhesives are generally organic and/or polymeric compounds featuring carbon-hydrogen bonds (and/or other interatomic bonds) that are easily damaged by UV radiation, leading to degradation of the encapsulant or adhesive. The degradation is particularly severe with exposure to UVC radiation (i.e., radiation at wavelengths less than 300 nm). Thus, using an encapsulant to improve photon extraction is typically ineffective with UV LEDs. And although UV-resistant encapsulants have been developed, even these compounds exhibit degradation upon exposures far less than the desired service lifetime of UV LEDs. For example, the Deep UV-200 encapsulant available from Schott North America, Inc. of Elmsford, N.Y., exhibits a 15% drop in transmittance for 300 nm light after only 1000 hours of exposure.

Thus, there is a need for an easily implementable approach to effectively increase the photon-extraction efficiency from UV LEDs that overcomes the lack of stable encapsulants that are transparent to UV radiation, particularly UVC radiation. Such an approach would desirably enable high transmittance and reliability of UV LEDs without significant degradation over the intended service lifetime of these devices, e.g., approximately 10,000 hours or even longer.

SUMMARY

In various embodiments of the present invention, the photon-extraction efficiency of UV light-emitting devices such as UV LEDs is improved via attachment of an inorganic (and typically rigid) lens directly to the LED die via a thin layer of an encapsulant (e.g., an organic, UV-resistant encapsulant compound). The lens typically includes or consists essentially of a UV-transparent (at least UVC-transparent) material such as sapphire, fused silica, or quartz. Other lens materials may be utilized, e.g., materials having an index of refraction greater than 1.3 and that are transparent and stable during exposure to high intensity short-wavelength UV radiation. The inorganic lens does not significantly degrade during operation of the UV device, resulting in at least a doubling (and even up to 2.6× or even larger increases) in the extracted quasi-continuous-wave output power of UV LEDs. In addition, the far field pattern (FWHM) of the devices may be narrowed by at least 20%. The lens is preferably shaped to minimize the amount of radiation which will undergo total internal reflection. Typically, this will be a round or hemispherical shape. In preferred embodiments, the lens shape has a cylindrical component and a hemispherical component in order to, e.g., narrow the far field pattern.

In one aspect, embodiments of the invention feature a method of forming an illumination device. A layer of non-rigid encapsulant is provided between a surface of a light-emitting semiconductor die and a surface of a rigid lens opposing the surface of the semiconductor die. The light-emitting semiconductor die preferably emits UV light. The rigid lens is attached to the semiconductor die, with the encapsulant, via application of a force sufficient to minimize the thickness of the encapsulant between the rigid lens and the semiconductor die. After attachment of the rigid lens, the thickness of the encapsulant is insufficient to prevent propagation of thermal expansion mismatch-induced strain between the rigid lens and the semiconductor die.

Embodiments of the invention may include one or more of the following in any of a variety of combinations. After attachment of the rigid lens, the thickness of the encapsulant may be approximately 10 µm or less, or even approximately 5 µm or less. The semiconductor die may emit light having a wavelength less than 300 nm. The transmittance of the encapsulant may decrease by at least 10% after at least 1000 hours of exposure to UV light. The transmittance of the rigid lens may decrease by 1% or less after at least 10,000 hours of exposure to UV light. The encapsulant may be organic, and may include or consist essentially of silicone. The rigid lens may be at least partially hemispherical, e.g., substantially hemispherical. The rigid lens may have a substantially hemispherical portion and a substantially cylindrical portion disposed thereunder (i.e., toward the semiconductor die). The rigid lens may be inorganic, and may include or consist essentially of fused silica, quartz, and/or sapphire. Prior to the provision of the layer of the encapsulant, the surface of the semiconductor die may be roughened, textured, and/or patterned. For light having a wavelength of approximately 260 nm, the index of refraction of the rigid lens may be approximately 1.5 and the index of refraction of the encapsulant may be approximately 1.4. The semiconductor die may be a light-emitting diode die or a laser die. The encapsulant may be partially or fully cured after applying the rigid lens. The diameter (or longest edge length, for lenses having polygonal surfaces) of the rigid lens may be at least twice an edge length or diameter of the semiconductor die.

In another aspect, embodiments of the invention feature an illumination device including or consisting essentially of a light-emitting semiconductor die (preferably one that emits UV light), a rigid lens for extracting light from the light-emitting semiconductor die, and a layer of encapsulant attaching the rigid lens to the light-emitting semiconductor die. The thickness of the encapsulant is insufficient to prevent propagation of thermal expansion mismatch-induced strain between the rigid lens and the light-emitting semiconductor die.

Embodiments of the invention may include one or more of the following in any of a variety of combinations. The rigid lens and the encapsulant may both be substantially transparent to light emitted by the light-emitting semiconductor die. The encapsulant may be organic, and may include or consist essentially of silicone. The rigid lens may be at least partially hemispherical, e.g., substantially hemispherical. The rigid lens may have a substantially hemispherical portion and a substantially cylindrical portion disposed thereunder. The rigid lens may be inorganic, and may include or consist essentially of fused silica, quartz, and/or sapphire. The thickness of the layer of encapsulant may be less than approximately 10 µm, or even less than approximately 5 µm. The layer of encapsulant may be disposed on a surface of the light-emitting semiconductor die that is roughened, textured, and/or patterned. The indices of refraction of the rigid lens and the encapsulant may be approximately equal to each other. For light having a wavelength of approximately 260 nm, the index of refraction of the rigid lens may be approximately 1.5 and the index of refraction of the encapsulant may be approximately 1.4. The light-emitting semiconductor die may include or consist essentially of a light-emitting diode die or a laser die. The diameter of the rigid lens may be at least twice the edge length or diameter of the light-emitting semiconductor die.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 11 is a table of photon extraction efficiencies and far field patterns as functions of lens dimensions and encapsulant thickness for various embodiments of the invention.

DETAILED DESCRIPTION

Figure 1A:
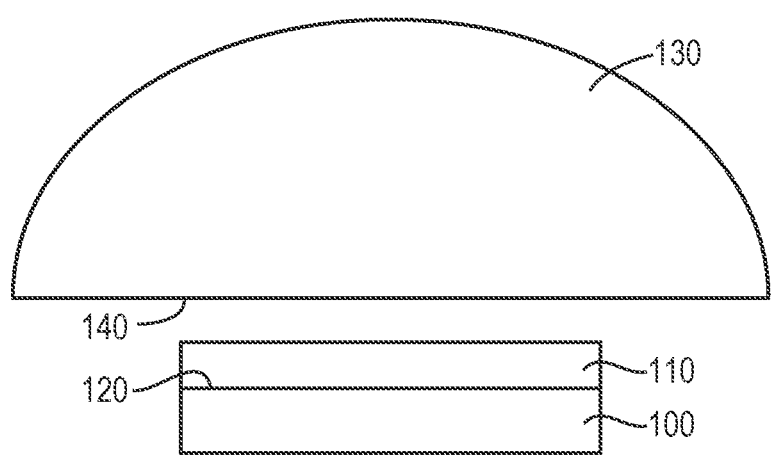
FIGS. 1A and 1B depict in cross-section the attachment of a rigid lens to an LED in accordance with various embodiments of the invention.

Embodiments of the invention include approaches to increase the photon-extraction efficiency of light-emitting devices such as UV LEDs by minimizing the total internal reflection of light transmitted from substrate into the surrounding ambient. The technique uses a thin layer (e.g., approximately 10 µm, or even thinner) of an encapsulant (e.g., an epoxy) that is transparent to short-wavelength UV radiation. FIG. 1A depicts a semiconductor die 100 having an encapsulant 110 disposed on a surface 120 thereof, as well as a lens 130 that will be attached to die 100 via the encapsulant 110. In some embodiments, the encapsulant 110 is applied to surface 140 of the lens 130 instead of or in addition to surface 120 of the die 100 prior to attachment of die 100 to lens 130.

The semiconductor die 100 may include or consist essentially of a light-emitting device such as an LED or a laser. In preferred embodiments, die 100 emits UV light. The encapsulant 110 may be organic and/or polymeric. In various embodiments of the invention, the encapsulant 110 is silicone-based, and may include or consist essentially of, for example, Deep UV-200 (mentioned above). Prior to attachment of the lens 130, the surface 120 of the die 100 may be treated, e.g., roughened, textured, and/or patterned, in order to maximize the light extraction therefrom (i.e., by increasing the critical angle for escape of the light), as described in U.S. Ser. No. 12/764,584, filed on Apr. 21, 2010, the entire disclosure of which is incorporated by reference herein.

Figure 1B:
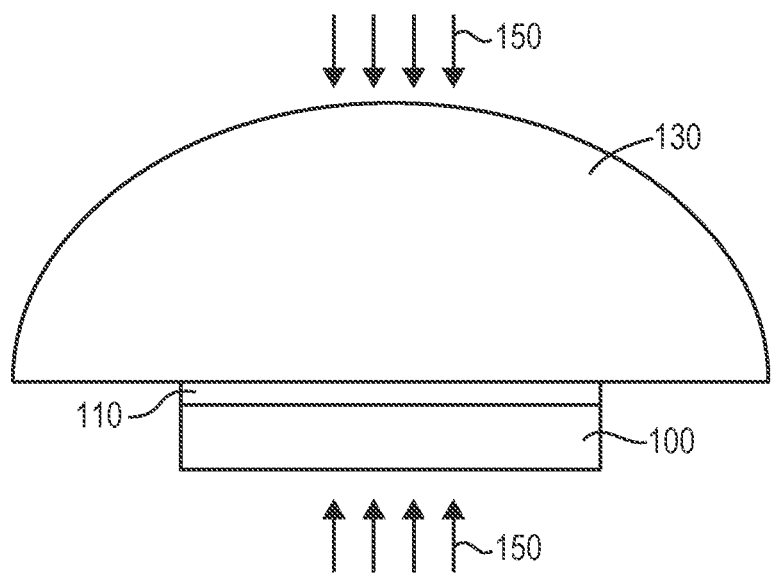

As shown in FIG. 1B, the lens 130 is attached to die 100 via the encapsulant 110 (which may also have adhesive properties). The lens 130 is typically rigid and, in preferred embodiments, is at least partially hemispherical in shape. Lens 130 may be substantially hemispherical, as shown in FIGS. 1A and 1B, or may be composed of a substantially hemispherical portion and a substantially cylindrical portion (as described below). The lens 130 is preferably inorganic, and may include or consist essentially of, for example, fused silica, quartz, and/or sapphire. In a preferred embodiment, the encapsulant 110 is heated (e.g., to approximately 60° C.) to provide enough fluidity to substantially gaplessly form an interface between lens 130 and die 100. Typically, the encapsulant 110 is heated at a temperature at which it still has sufficient viscosity to enable proper positioning of the lens 130 on the die 100, even after contact therebetween. In preferred embodiments, force (represented by arrows 150 in FIG. 1B) is applied to the die 100 and/or the lens 130 in order to minimize the space therebetween, and thus also minimize the thickness of the encapsulant 110 therein. Even in embodiments in which the encapsulant 110 degrades (due to, e.g., exposure to UV light from die 100), the thin thickness of the layer substantially prevents degradation of the performance of the device. After the lens 130 is positioned on die 100, the entire structure is typically raised to an even higher temperature (e.g., up to 150° C. for 15 hours) to cure the encapsulant 110 and solidify the attachment of the lens 130 to the die 100.

Figure 2:
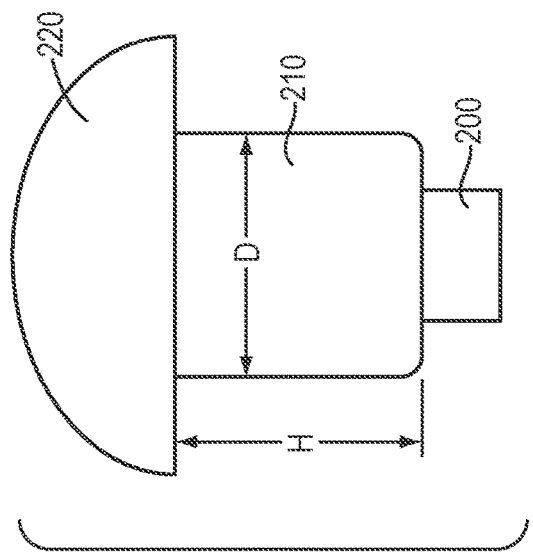
FIG. 2 is a schematic cross-section of an illumination device incorporating an LED die, an encapsulant, and a rigid lens in accordance with various embodiments of the invention.
Figure 3A:
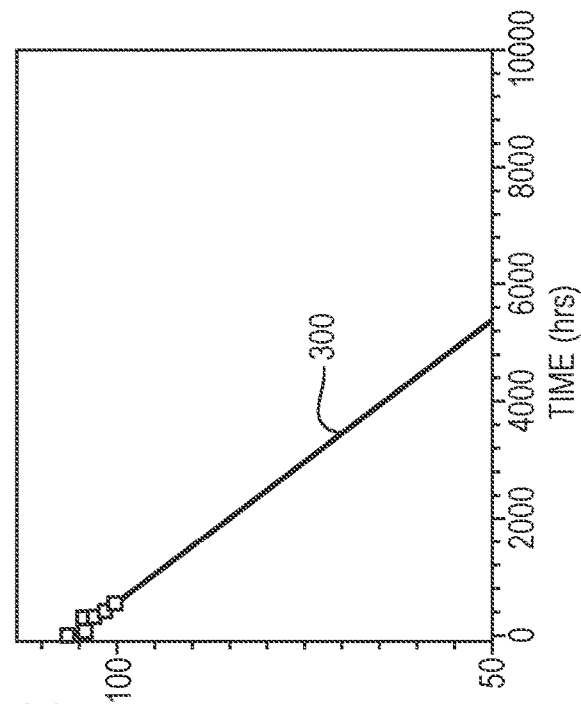
FIGS. 3A and 3B are, respectively, linear and logarithmic plots of light transmission through the encapsulant depicted in FIG. 2 as a function of time.
Figure 3B:
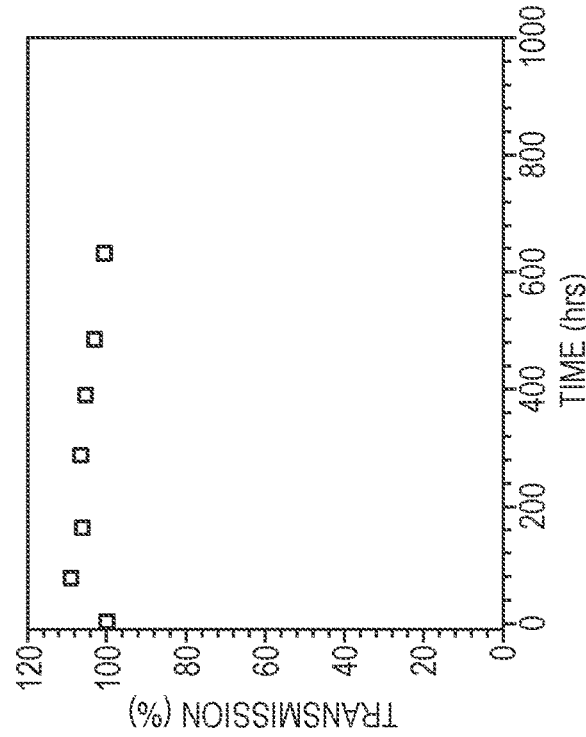

Preferred embodiments of the present invention utilize thin layers of the encapsulant material in order to ameliorate the effects of the deterioration of such layers. As mentioned above, even encapsulants rated for use with UV-emitting light tend to degrade over time, impacting the transmission of light therethrough. FIG. 2 is a schematic (with various dimensions grossly exaggerated for clarity) of an LED die 200 emitting light at a wavelength of 265 nm positioned in contact with a cylinder of encapsulant 210 (e.g., a silicone-based encapsulant such as Deep UV-200) having a diameter D of 1.2 mm and a height H of 1.0 mm, on which is disposed a lens 220. The light transmission through the encapsulant 210 was measured as a function of time, as shown in FIGS. 3A and 3B. FIG. 3A is a linear plot of light transmission (normalized to the transmission at time 0) as a function of time, and FIG. 3B is a logarithmic plots of the same data. As shown, the transmission tends to decrease as a function of time. The normalized linear fit 300 in FIG. 3B assumes the absorption coefficient of the encapsulant ($\alpha_{ENCAP}$) is linearly dependent on time and light dose (i.e., the emission power of the die, e.g., the LED power):

$$\alpha_{ENCAP} \approx C \times P_{LED} \times t;$$

$$T_{transmission} = \exp(-\alpha_{ENCAP} \times L_{ENCAP\text{-}height}) = \exp(-C \times P_{LED} \times L_{ENCAP\text{-}height} \times t).$$

In such embodiments, the impact on light transmission correlates to both the power of the LED and the thickness of the encapsulant. For example, in the case illustrated in FIGS. 3A and 3B, the LED power is 1 mW and the encapsulant thickness is 1 mm, and the lifetime L50 (i.e., the time required for the light transmission to be reduced by 50%) is over 5000 hours. Thus, substantially the same lifetime L50 for an LED emitting at 100 mW and an encapsulant thickness of 10 μm would be predicted. Therefore, particularly for high-power LEDs, preferred embodiments of the invention utilize layers of encapsulant having thicknesses less than approximately 10 μm.

It is important to note that the lifetime of the overall device (i.e., the semiconductor die with the rigid lens attached) is improved by making the encapsulant layer as thin as possible. Such thickness minimization may be achieved by applying force to the lens and/or the die during the curing process. The minimization of encapsulant thickness typically renders the encapsulant thickness insufficient for the encapsulant to function as a thermal expansion mismatch buffer (in which case one would typically increase the encapsulant thickness to prevent strain propagation therethrough and improve reliability of the device). FIGS. 4A, 4B, 5A, and 5B depict the impact of temperature change (resulting from, e.g., the elevated temperature of the die during light emission) on the strain profile within the assembled device in accordance with various embodiments of the present invention.

Figure 4A:
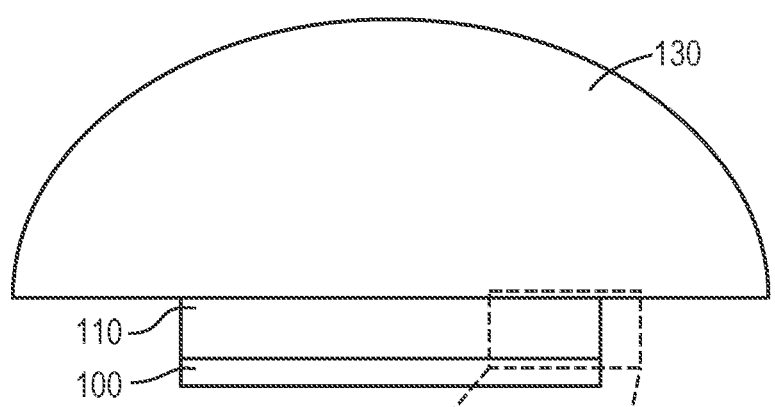
FIG. 4A is a schematic cross-section of, at room temperature, an illumination device incorporating an LED die, an encapsulant, and a rigid lens in accordance with various embodiments of the invention.
Figure 4B:
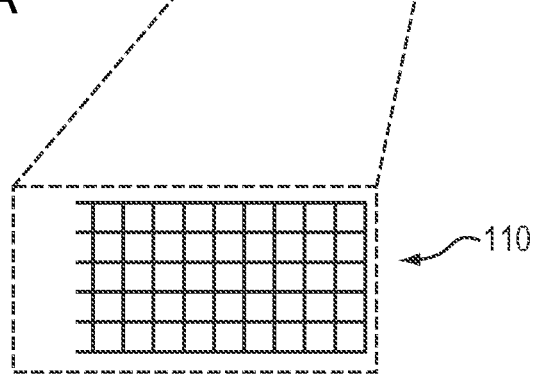
FIG. 4B is a magnified representation of the stress state within the encapsulant of FIG. 4A.

FIGS. 4A and 4B depict an assembled device and the strain state of the encapsulant 110 at approximately room temperature (e.g., after assembly but while die 100 is not operating). As shown, since the device is at approximately the temperature at which it was assembled, there is approximately no thermal-mismatch strain resulting from and/or propagating between the die 100 and the lens 130, despite the fact that their expansions of thermal expansion are different. FIG. 4B indicates that, in this situation, there is substantially no shear stress within the encapsulant 110 indicative of such thermal-mismatch strain.

Figure 5A:
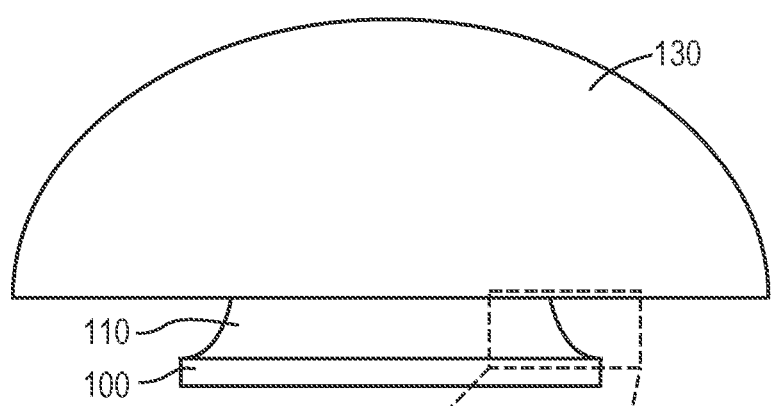
FIG. 5A is a schematic cross-section of, at elevated temperature, an illumination device incorporating an LED die, an encapsulant, and a rigid lens in accordance with various embodiments of the invention.
Figure 5B:
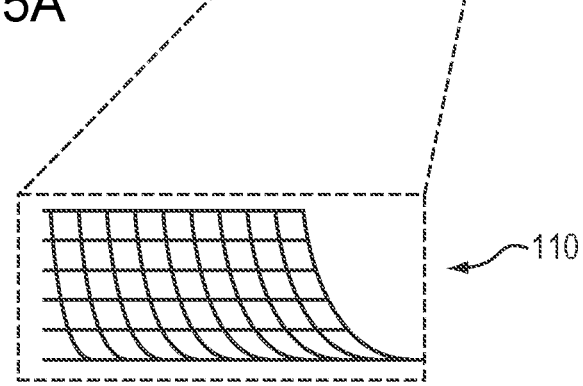
FIG. 5B is a magnified representation of the stress state within the encapsulant of FIG. 5A.

In contrast, FIGS. 5A and 5B depict the assembled device and the strain state of the encapsulant 110 at elevated temperature (e.g., during operation of die 100). As shown, the difference in thermal-expansion coefficients of the lens 130 and the die 100 results in thermal-mismatch strain propagating therebetween, as indicated by the shear stress and deformation through the entirety of the layer of encapsulant 110. Specifically, in this case the thickness of the encapsulant 110 is insufficient to accommodate the thermal mismatch-induced strain and prevent its propagation between die 100 and lens 130. (In the contrary case where the thickness of the encapsulant is sufficiently thick, at least a portion of the encapsulant layer would greatly resemble the encapsulant 110 shown in FIG. 4B, as the shear stress within the layer would be proportionally smaller.) The linear thermal expansion coefficient of die 100 may be larger than that of the lens 130, for example, larger by approximately a factor of 10 or more. In one embodiment, die 100 includes or consists essentially of single-crystal AlN and has a linear thermal expansion coefficient of approximately $5 \times 10^{-6}$/K, while lens 130 includes or consists essentially of silica and has a linear thermal expansion coefficient of approximately $0.6 \times 10^{-6}$/K. Despite the amount of shear stress through the entire thickness of the encapsulant 110, and thus the amount of thermal expansion mismatch-induced strain propagating between lens 130 and die 100, the optical performance of the assembled device is surprisingly superior due to the minimized thickness of the encapsulant 110, which limits the decrease in optical transmission due to light-induced deterioration of encapsulant 110 (which tends to occur even for encapsulants purportedly immune to UV-induced deterioration).

Figure 6A:
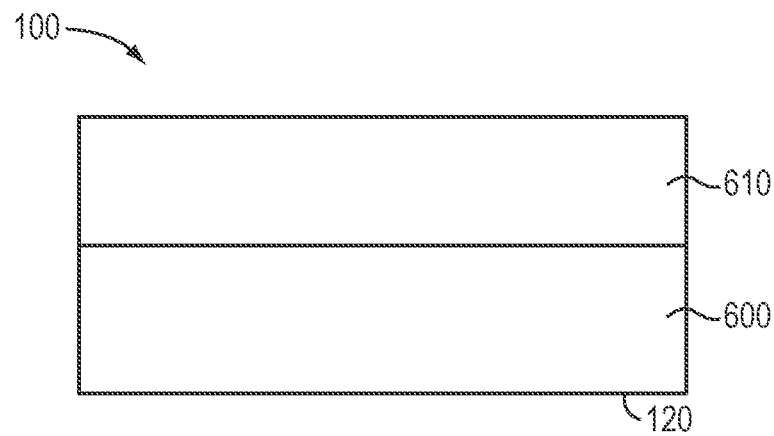
FIG. 6A is a schematic cross-section of a semiconductor die utilized in embodiments of the invention.

The impact of the thermal-mismatch strain may be decreased via reduction of the thickness of die 100 by, e.g., removal of at least a portion of the substrate, on which the light-emitting layers are formed, thereof. Such thinning may be performed in addition to, or in conjunction with, the surface patterning described above with reference to FIGS. 1A and 1B, as described in U.S. Pat. No. 8,080,833, filed Apr. 21, 2010, the entire disclosure of which is incorporated by reference herein. FIG. 6A schematically depicts a semiconductor die 100 that incorporates a substrate 600 and, thereover, a layered region 610 that includes or consists essentially of one or more epitaxially deposited semiconductor layers including the active region of die 100. The substrate 600 is typically a semiconductor material, e.g., silicon, GaN, GaAs, InP, or AlN, but in preferred embodiments includes or consists essentially of single-crystal AlN. In embodiments in which die 100 is a light-emitting device, layered region 610 typically includes one or more of buffer layers, cap layers, contact layers, quantum wells, multiple quantum well (MQW) regions (i.e., multiple quantum wells separated by thin barrier layers), as known to those of skill in the art.

Figure 6B:
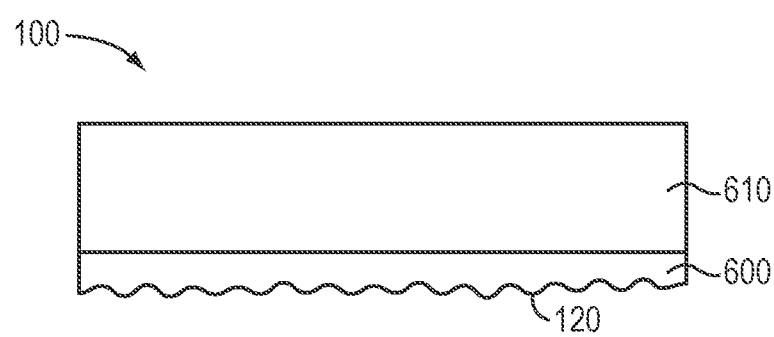
FIG. 6B depicts the semiconductor die of FIG. 6A after substrate thickness reduction and texturing performed in accordance with embodiments of the invention.

In order to mitigate the impact of thermal-mismatch strain on die 100 and enhance light transmission from die 100, at least a portion of substrate 600 may be removed and/or textured, as shown in FIG. 6B. If, for example, substrate 600 has a total thickness variation higher than about 20 μm, then the back surface 120 may be ground, for example, with a 600 to 1800 grit wheel. The removal rate of this step may be purposefully maintained at a low level (approximately 0.3-0.4 μm/s) in order to avoid damaging the substrate 600 or the layered region 610. After the optional grinding step, the back surface 120 may be polished with a polishing slurry, e.g., a solution of equal parts of distilled water and a commercial colloidal suspension of silica in a buffered solution of KOH and water. The removal rate of this step may vary between approximately 10 μm/min and approximately 15 μm/min. Substrate 600 may be thinned down to a thickness of approximately 200 μm to approximately 250 μm, or even to a thickness of approximately 20 μm to approximately 50 μm, although the scope of the invention is not limited by this range. In other embodiments, the substrate 600 is thinned to approximately 20 μm or less, or even substantially completely removed. The thinning step is preferably followed by wafer cleaning in, e.g., one or more organic solvents. In one embodiment of the invention, the cleaning step includes immersion of substrate 600 in boiling acetone for approximately 10 minutes, followed by immersion in boiling methanol for approximately 10 minutes.

Once substrate 600 is cleaned, the surface 120 thereof may be patterned, i.e., textured, by etching in a suitable solution (e.g., a basic solution such as KOH in deionized (DI) water). In another embodiment of the invention, the etching agent is a solution of NaOH in DI water. The molarity of the basic solution may vary between approximately 1M and approximately 20M, and the etching time may vary between approximately 1 minute and approximately 60 minutes. The temperature of the etching solution may vary between approximately room temperature up to approximately 100° C. Similar results may be obtained when using a higher molarity solution for shorter periods of time and vice versa. In one embodiment of the invention, substrate 600 is etched in a 4M solution of KOH and DI water for 8 minutes while maintaining the solution at approximately 20° C.

The rigid lens 130 may be formed in the desired shape and size from a larger piece of the desired material or may be directly "molded" into the desired shape and size. For example, in accordance with various embodiments of the invention, a sol-gel process is utilized to form the lens 130. For example, in order to produce a fused-silica lens, a precursor chemical solution containing nano-scaled silica particles may be inserted into a mold where it thickens into a gel. The thickened part is then removed from the mold and dried, resulting in an open-pore material having pores that may be filled with a gas. The dried part is then sintered at temperatures of, for example, greater than 1000° C., during which the part shrinks to the desired dimensions and densifies into a material nearly identical to fused silica and with high transparency in the deep UV. The lens 130 may contain trace amounts of carbon or other elements from, e.g., the precursor solution. Designations for lenses herein such as "fused silica" and the like also encompass such materials formed by solution processing (such as sol-gel processes), even if such materials also contain trace elements such as carbon. Moldable processes such as sol-gel processes enable the tuning of exact dimensions and shape with high reproducibility and low cost when producing rigid lenses such as the fused-silica lenses described above.

Figure 7:
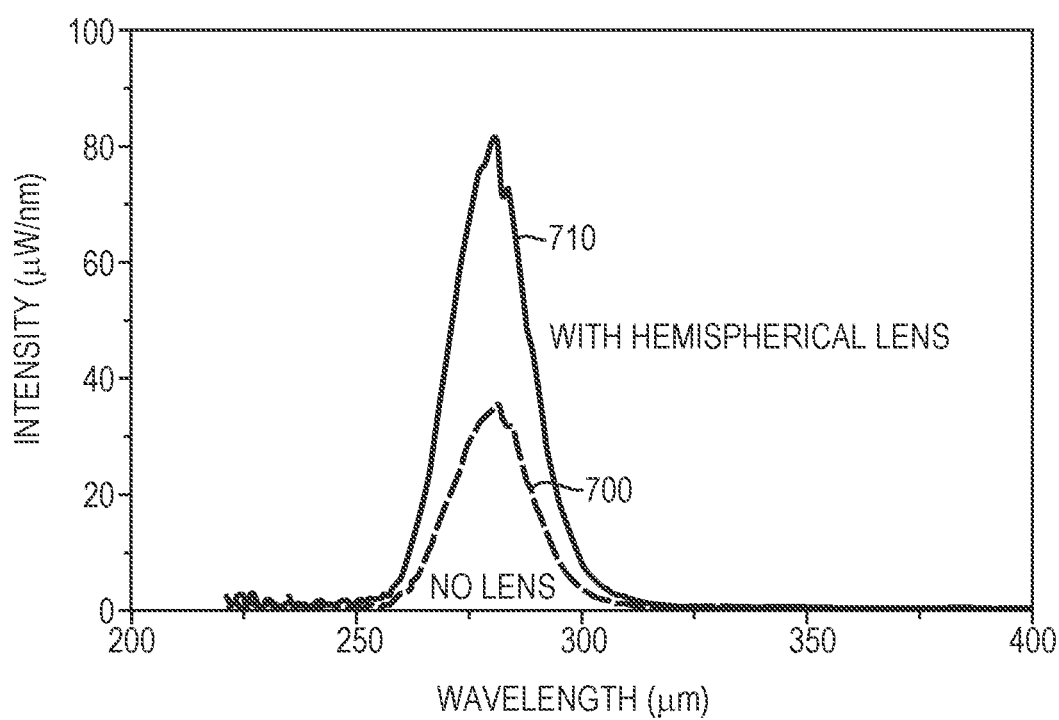
FIG. 7 depicts plots of the light intensity emitted from a UV LED with and without a rigid lens applied thereto in accordance with embodiments of the invention.

Due to the larger refractive index of the encapsulant 110 (e.g., around 1.4 at 260 nm) compared to the air, the critical angle calculated from Snell's law for total internal reflection from the substrate 600 (e.g., AlN) into the encapsulant 110 is increased, which in turn increases the photon-extraction efficiency of the device. The lens 130 then extracts substantially all of the light from the encapsulant 110, as the lens 130 preferably has a similar refractive index (e.g., around 1.5 at 260 nm). The lens 130 is also typically larger in size than the die 100 in order to extract as much light as possible from the die 100. In an embodiment, the die 100 is approximately 0.8 mm on a side, and the lens 130 is hemispherical with a diameter of approximately 2 mm. As shown in FIG. 7, the output power of an exemplary UV LED is increased by approximately 2.6× with the addition of a hemispherical fused silica lens 130 attached to the die 100 with a thin layer of an encapsulant 110. FIG. 7 includes plots, as functions of wavelength, of the intensity 700 of light emitted without the lens 130 and the intensity 710 of light emitted with the lens 130.

Figure 8:
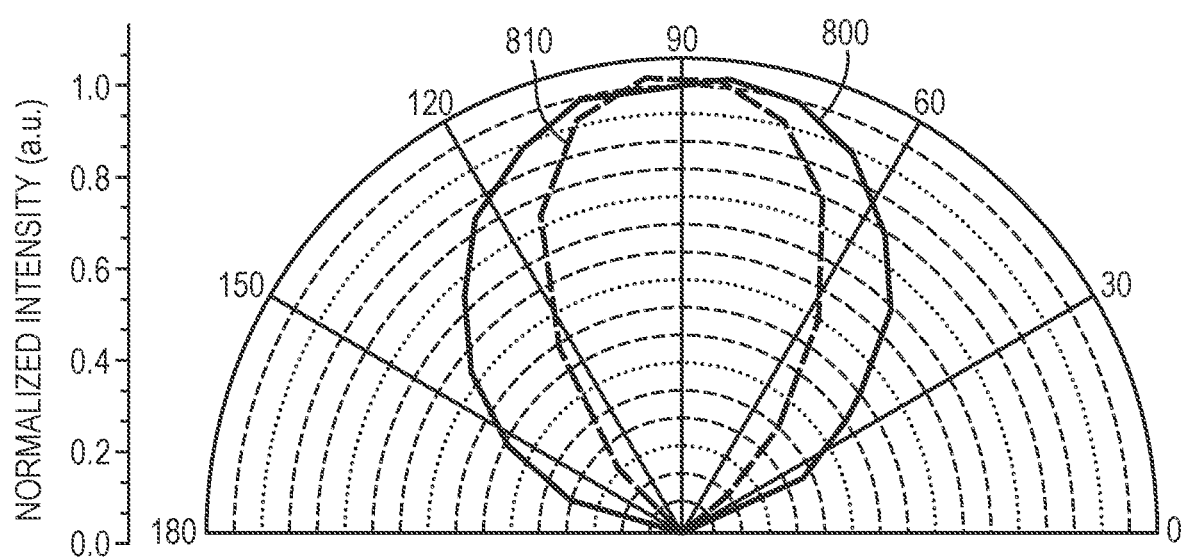
FIG. 8 depicts plots of far filed patterns of light-emitting dies with and without a rigid lens applied thereto in accordance with embodiments of the invention.

The radiation pattern of a light-emitting semiconductor die 100, e.g., an LED, may also be improved via selection of the inorganic lens material and shape of its surface. FIG. 8 depicts the full width, half-maximum (FWHM) of the radiation pattern from an LED both with and without a sapphire lens attached to the LED die 100 with a thin layer of encapsulant 110. As shown, the far field pattern 800 of the LED die 100 without lens 130 has a FWHM of approximately 120°, while with the sapphire lens 130, the far field pattern 810 has a FWHM of approximately 72°. The far field pattern may be reduced even further via use of a cylindrical-hemispherical lens, as detailed below.

Figure 9:
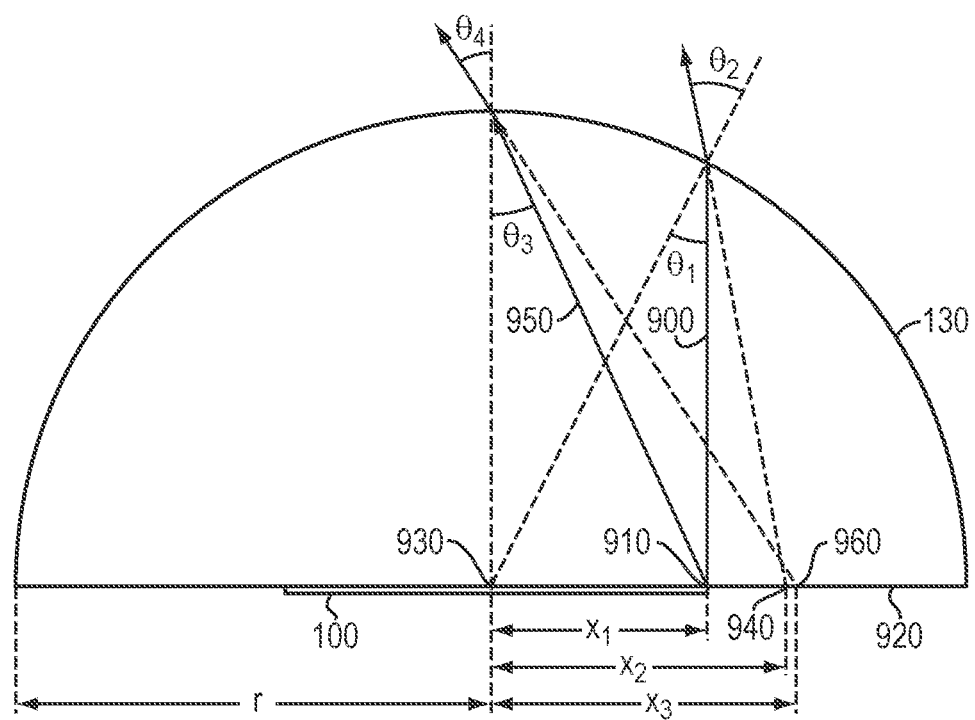
FIG. 9 is a schematic depiction of the effect of lens size on the distortion of light from a semiconductor die attached thereto in accordance with embodiments of the invention.

Typically, the radiation pattern emitted by an LED after attachment of a hemispherical lens will remain Lambertian (as shown in FIG. 8) after attachment of the lens if the encapsulant is kept very thin. However, the size of the emitting surface will generally be magnified by the addition of the lens. The amount of this magnification will be equal to the index of refraction of the lens and the distortion of the LED will be reduced by making the lens diameter larger relative to the size of the LED. That is (and as shown in FIG. 9), $$\frac{X_2}{X_1} = \frac{\frac{r*\sin\theta_2}{\cos(\theta_2 - \theta_1)}}{r*\sin\theta_1} = \frac{n}{\cos(\theta_2 - \theta_1)} \quad (1)$$

$$\sin\theta_2 = n*\sin\theta_1 \quad (2)$$

$$\frac{X_3}{X_1} = \frac{\frac{r}{\tan\theta_4}}{\frac{r}{\tan\theta_3}} = \frac{n}{\frac{\cos\theta_4}{\cos\theta_3}} \quad (3)$$

$$\sin\theta_4 = n*\sin\theta_3 \quad (4)$$

where a ray 900 is a light ray emitted from a point 920 on the LED 100 in the direction perpendicular to the flat surface 920 of hemispherical lens 130; $X_1$ is the distance between point 920 and center point 930 of the LED 100; $X_2$ is the distance between the point 940, where the reverse extending line of ray 900's emergent ray intersects with the flat surface 920, and center point 930; r is the radius of hemispherical lens 130; $\theta_1$ is the incident angle of ray 900; $\theta_2$ is the transmission angle of ray 900; n is the refractive index of the hemispherical lens 130; ray 950 is a light ray emitted from point 910 through the point directly above center point 930; $X_3$ is the distance between the point 960, where the reverse extending line of ray 950's emergent ray intersects with the flat surface of hemispherical lens 130, and center point 930; $\theta_3$ is the incident angle of ray 950; and $\theta_4$ is the transmission angle of ray 950.

As indicated by equations (1) and (3) above, when $X_1$ is much smaller than r, $X_2/X_1$ and $X_3/X_1$ both converge to n and the two reserve extended lines intersect almost at the same point on the flat surface of lens 130. For dies 100 with an edge length (or diameter, for circular dies) comparable to twice the radius r (i.e., the diameter) of the lens 130, the image of (and thus the light emitted from) die 100 is distorted. Thus, in preferred embodiments of the invention, the diameter of lens 130 is significantly larger (e.g., at least two times larger, five times larger, or even ten times larger or more) than an edge length or diameter of die 100 to minimize distortion of light from die 100.

Figure 10:
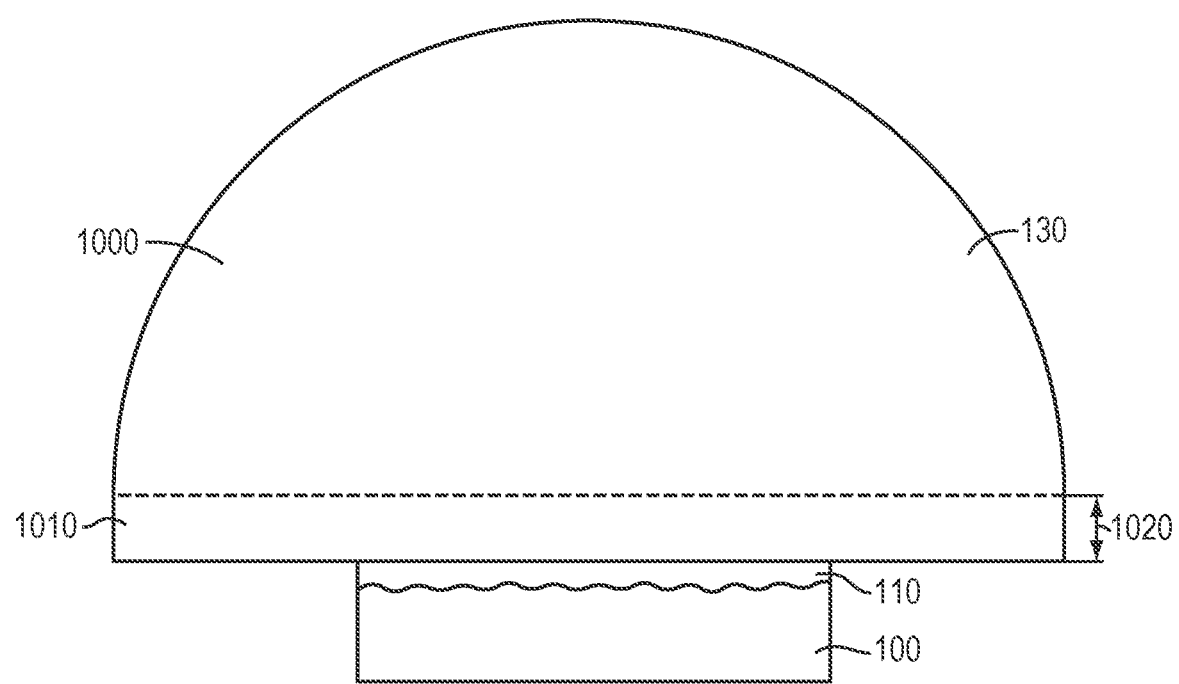
FIG. 10 is a schematic cross-section of a lens having hemispherical and cylindrical portions attached to a light-emitting semiconductor die in accordance with various embodiments of the invention.

The far field divergence of the die 100 (e.g., an LED) is improved with little or no impact on photon extraction efficiency in accordance with various embodiments of the present invention via the use of a lens 130 having a shape with a cylindrical component as well as a hemispherical component, as shown in FIGS. 10 and 11. FIG. 10 depicts an LED die 100 (e.g., a mid-UV LED) having a roughened (i.e., textured) surface 120 and attached to such a lens 130 via a thin layer of encapsulant 110 (e.g., a silicone-based encapsulant). As shown, the lens 130 has a hemispherical portion 1000 and a cylindrical portion 1010 (e.g., having a constant diameter equal to that of the largest diameter of hemispherical portion 1000) having a thickness, or "cylinder height" 1020. Simulations were performed to determine the photon extraction efficiency and far field divergence of various different embodiments. The results are compared to a baseline value of photon extraction efficiency for a bare (but roughened) LED without the lens 130 or encapsulant 110, shown as Case 1 in FIG. 11. Cases 2 and 3 represent embodiments in which the lens 130 is purely hemispherical (i.e., no cylindrical component), demonstrating the above-described increase in photon extraction efficiency and modest improvement in the far field divergence. As FIG. 11 illustrates, increasing the thickness of the cylindrical component of the lens enables the decrease of far field divergence to at least 40° FWHM with little or no deleterious effect on the photon extraction efficiency, and to even lower levels (i.e., to at least 25°) with only modest impact on the photon extraction efficiency (which remains much improved over that of the Case 1 baseline value). This nearly collimated beam of UV light is very desirable for certain applications that utilize a concentrated beam. As also shown in FIG. 11, increases in the lens diameter also tend to improve photon extraction efficiency and to decrease the far field divergence, as also discussed above.

In addition to improving the light extraction efficiency of a single semiconductor die, embodiments of the invention exhibit similar results when utilizing an array of two or more semiconductor dies (e.g., LED dies). For example, a 4×4 array of dies may be used with a rigid lens having a diameter that is significantly larger (e.g., at least two times larger, five times larger, or even ten times larger or more) than an edge length or diameter of the array to minimize distortion of light. Modeling was performed for arrays of different sizes (i.e., different numbers of dies) and showed that a relatively larger diameter of the lens compared to the edge length or diameter of a full array may be necessary to achieve similar improvement of the photon extraction efficiency compared to embodiments incorporating a single small semiconductor die. The modeling results are shown in the table below.

| Size of LED array | Edge Lengths of the Array | Lens Material | Lens Diameter | Photon Extraction Efficiency | Far Field FWHM |
| --- | --- | --- | --- | --- | --- |
| 1 × 1 | 0.8 × 0.8 mm | N/A | N/A | 1.0 × | 120° |
| 1 × 1 | 0.8 × 0.8 mm | Fused Silica | 2 mm | 2.2 × | 114° |
| 3 × 3 | 3.8 × 3.4 mm | Fused Silica | 6 mm | 1.9 × | 140° |
| 3 × 3 | 3.8 × 3.4 mm | Fused Silica | 8 mm | 2.2 × | 134° |
| 4 × 4 | 5.3 × 4.7 mm | Fused Silica | 8 mm | 1.9 × | 144° |
| 4 × 4 | 5.3 × 4.7 mm | Fused Silica | 10 mm | 2.2 × | 140° |
| 5 × 5 | 6.8 × 6.0 mm | Fused Silica | 10 mm | 1.9 × | 144° |
| 5 × 5 | 6.8 × 6.0 mm | Fused Silica | 14 mm | 2.2 × | 134° |

In addition, a 3×3 array of light-emitting semiconductor dies was integrated with a 6 mm diameter rigid lens and exhibited an improvement of light extraction efficiency of 1.4×, even though the lens was not large enough to fully optimize the photon extraction efficiency. Therefore, embodiments of the invention incorporating even larger lenses will exhibit improvements in photon extraction efficiency of 2× or even more.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An illumination device comprising:
   a ultraviolet (UV) light-emitting semiconductor die;
   a rigid lens for extracting light from the light-emitting semiconductor die, the rigid lens having a mounting surface and a transmission surface opposite the mounting surface; and
   a layer of encapsulant disposed between the light-emitting semiconductor die and the mounting surface of the rigid lens, whereby the light-emitting semiconductor die is attached to the rigid lens by the layer of encapsulant,
   wherein (i) a thickness of the encapsulant is less than approximately 10 µm, and (ii) at least a portion of the rigid lens between the mounting surface and the transmission surface has a straight vertical sidewall.

2. The illumination device of claim 1, wherein a thickness of the at least a portion of the rigid lens is at least 0.5 mm.

3. The illumination device of claim 1, wherein a thickness of the at least a portion of the rigid lens is at least 1.0 mm.

4. The illumination device of claim 1, wherein a thickness of the at least a portion of the rigid lens is at least 1.9 mm.

5. The illumination device of claim 1, wherein the light-emitting semiconductor die comprises a layered region not disposed on a semiconductor substrate, the layered region comprising one or more quantum wells for emission of UV light.

6. The illumination device of claim 1, wherein the light-emitting semiconductor die comprises a layered region disposed on an AlN substrate, the layered region comprising one or more quantum wells for emission of UV light, wherein a thickness of the AlN substrate is less than 50 µm.

7. The illumination device of claim 6, wherein a surface of the AlN substrate opposite the layered region is at least one of roughened, textured, or patterned.

8. The illumination device of claim 1, wherein a length of the mounting surface is at least 2 mm.

9. The illumination device of claim 1, wherein a length of the mounting surface is at least 10 mm.

10. The illumination device of claim 1, wherein a length of the mounting surface is at least 14 mm.

11. The illumination device of claim 1, wherein the rigid lens is inorganic.

12. The illumination device of claim 1, wherein the rigid lens comprises at least one of fused silica, quartz, or sapphire.

13. The illumination device of claim 1, wherein the thickness of the layer of encapsulant is less than 5 µm.

14. The illumination device of claim 1, wherein the encapsulant is organic.

15. The illumination device of claim 1, wherein the encapsulant comprises silicone.

16. The illumination device of claim 1, wherein indices of refraction of the rigid lens and the layer of encapsulant are approximately equal to each other.

17. The illumination device of claim 1, wherein the light-emitting semiconductor die is a light-emitting diode die.

18. The illumination device of claim 1, wherein the transmission surface of the rigid lens is curved or hemispherical.

19. A method of forming an illumination device, the method comprising:
   providing a layer of non-rigid encapsulant between a surface of an ultraviolet (UV) light-emitting semiconductor die and a mounting surface of a rigid lens opposing the surface of the light-emitting semiconductor die, wherein the rigid lens has a transmission surface opposite the mounting surface; and
   with the encapsulant, attaching the rigid lens to the light-emitting semiconductor die via application of a force sufficient to minimize a thickness of the encapsulant between the rigid lens and the light-emitting semiconductor die,
   wherein (i) after attachment of the rigid lens, a thickness of the encapsulant is less than approximately 10 µm, and (ii) at least a portion of the rigid lens between the mounting surface and the transmission surface has a straight vertical sidewall.

20. The method of claim 19, wherein a thickness of the at least a portion of the rigid lens is at least 1.0 mm.

21. The method of claim 19, wherein a length of the mounting surface is at least 2 mm.

22. The method of claim 19, wherein a length of the mounting surface is at least 10 mm.

23. The method of claim 19, wherein a length of the mounting surface is at least 14 mm.

24. The method of claim 19, wherein the rigid lens comprises at least one of fused silica, quartz, or sapphire.

25. The method of claim 19, wherein, after attachment of the rigid lens, the thickness of the encapsulant is less than 5 µm.

26. The method of claim 19, wherein the transmission surface of the rigid lens is curved or hemispherical.

27. A method of forming an illumination device, the method comprising:
   providing a light-emitting array comprising a plurality of ultraviolet (UV) light-emitting semiconductor dies;
   providing a layer of non-rigid encapsulant between a surface of each light-emitting semiconductor die and a mounting surface of a rigid lens, wherein the rigid lens has a transmission surface opposite the mounting surface; and
   with the encapsulant, attaching the light-emitting array to the rigid lens via application of a force sufficient to minimize a thickness of the encapsulant between the rigid lens and each light-emitting semiconductor die,
   wherein (i) after attachment of the light-emitting array to the rigid lens, a thickness of the encapsulant between each light-emitting semiconductor die and the rigid lens is less than approximately 10 µm, and (ii) at least a portion of the rigid lens between the mounting surface and the transmission surface has a straight vertical sidewall.

28. The method of claim 27, wherein a thickness of the at least a portion of the rigid lens is at least 1.0 mm.

29. The method of claim 27, wherein a length of the mounting surface is at least 2 mm.

30. The method of claim 27, wherein a length of the mounting surface is at least 10 mm.

31. The method of claim 27, wherein a length of the mounting surface is at least 14 mm.

32. The method of claim 27, wherein the rigid lens comprises at least one of fused silica, quartz, or sapphire.

33. The method of claim 27, wherein, after attachment of the light-emitting array to the rigid lens, the thickness of the encapsulant between each light-emitting semiconductor die and the rigid lens is less than 5 µm.

34. The method of claim 27, wherein the transmission surface of the rigid lens is curved or hemispherical.

35. The method of claim 27, wherein a length of the mounting surface is at least ten times larger than an edge length of the light-emitting array, the edge length of the light-emitting array extending along a plurality of the light-emitting semiconductor dies.

* * * * *